(12) United States Patent
Sung et al.

(10) Patent No.: US 10,141,362 B2
(45) Date of Patent: Nov. 27, 2018

(54) SEMICONDUCTOR DEVICE HAVING PROTECTION LAYER WRAPPING AROUND CONDUCTIVE STRUCTURE

(71) Applicant: TAIWAN SEMICONDUCTOR MANUFACTURING CO., LTD., Hsinchu (TW)

(72) Inventors: Chih-Wei Sung, Kaohsiung (TW); Yi-Hung Chen, Kaohsiung (TW); Keng-Ying Liao, Tainan (TW); Yi-Fang Yang, Tainan (TW); Chih-Yu Wu, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/917,976

(22) Filed: Mar. 12, 2018

(65) Prior Publication Data

US 2018/0315790 A1 Nov. 1, 2018

Related U.S. Application Data

(62) Division of application No. 15/498,741, filed on Apr. 27, 2017, now Pat. No. 9,929,203.

(51) Int. Cl.
*H01L 27/146* (2006.01)

(52) U.S. Cl.
CPC .... *H01L 27/14636* (2013.01); *H01L 27/1463* (2013.01); *H01L 27/1464* (2013.01); *H01L 27/14609* (2013.01); *H01L 27/14643* (2013.01); *H01L 27/14687* (2013.01); *H01L 27/14689* (2013.01)

(58) Field of Classification Search
None
See application file for complete search history.

(56) References Cited

U.S. PATENT DOCUMENTS

| 6,228,511 | B1 | 5/2001 | Sachdev et al. |
| 8,148,728 | B2 | 4/2012 | Or-Bach et al. |
| 8,183,630 | B2 | 5/2012 | Batude et al. |
| 9,276,033 | B2 | 3/2016 | Takahashi et al. |
| 2002/0115310 | A1 | 8/2002 | Ueda |
| 2012/0248580 | A1* | 10/2012 | Matsugai ............... H01L 22/12 257/621 |

(Continued)

*Primary Examiner* — Ali Naraghi
(74) *Attorney, Agent, or Firm* — McClure, Qualey & Rodack, LLP

(57) ABSTRACT

A semiconductor device having a protection layer wrapping around a conductive structure is provided. The semiconductor device comprises an image sensor device layer, an interconnect layer over the image sensor device layer, a first bonding layer over the interconnect layer, a second bonding layer bonded with the first bonding layer, a substrate over the second bonding layer, and a conductive via passing through the substrate, the second bonding layer, and the first bonding layer. The conductive via comprises a protection layer and a conductive material. The protection layer is peripherally enclosed by the substrate, the second bonding layer, and the first bonding layer. The protection layer covers a sidewall cut formed at an interface of the second bonding layer and the first bonding layer. The conductive material is peripherally enclosed by the protection layer.

19 Claims, 16 Drawing Sheets

(56) References Cited

U.S. PATENT DOCUMENTS

| | | | |
|---|---|---|---|
| 2012/0256319 A1* | 10/2012 | Mitsuhashi | H01L 27/14634 257/774 |
| 2012/0267690 A1* | 10/2012 | Endo | H01L 27/14632 257/225 |
| 2015/0270288 A1 | 9/2015 | Yamazaki et al. | |
| 2015/0348909 A1 | 12/2015 | Yamazaki et al. | |
| 2015/0348997 A1 | 12/2015 | Sasagawa et al. | |
| 2015/0349127 A1 | 12/2015 | Kurata et al. | |
| 2016/0056196 A1* | 2/2016 | Li | H01L 27/14636 257/432 |
| 2017/0154873 A1* | 6/2017 | Kim | B60H 1/00764 |

* cited by examiner

SEMICONDUCTOR DEVICE HAVING PROTECTION LAYER WRAPPING AROUND CONDUCTIVE STRUCTURE

RELATED APPLICATION

The present application is a Divisional Application of the U.S. application Ser. No. 15/498,741, filed Apr. 27, 2017, now U.S. Pat. No. 9,929,203, issued Mar. 27, 2018, which is incorporated herein by reference in its entirety.

BACKGROUND

Many modern electronic devices include image sensors which convert optical signals to electrical signals. One type of the image sensors commonly used in the electronic devices is a stacked complementary metal-oxide-semiconductor (CMOS) image sensor (CIS). Based on different light paths, the stacked CIS includes a backside illumination (BSI) image sensor and a frontside illumination (FSI) image sensor. Typically, the BSI image sensor is fabricated by bonding a carrier wafer with an active wafer. In order to conduct the carrier wafer and the active wafer, a conductive via is formed to transmit the electrical signals converted by light-sensitive pixel devices of the BSI image sensor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
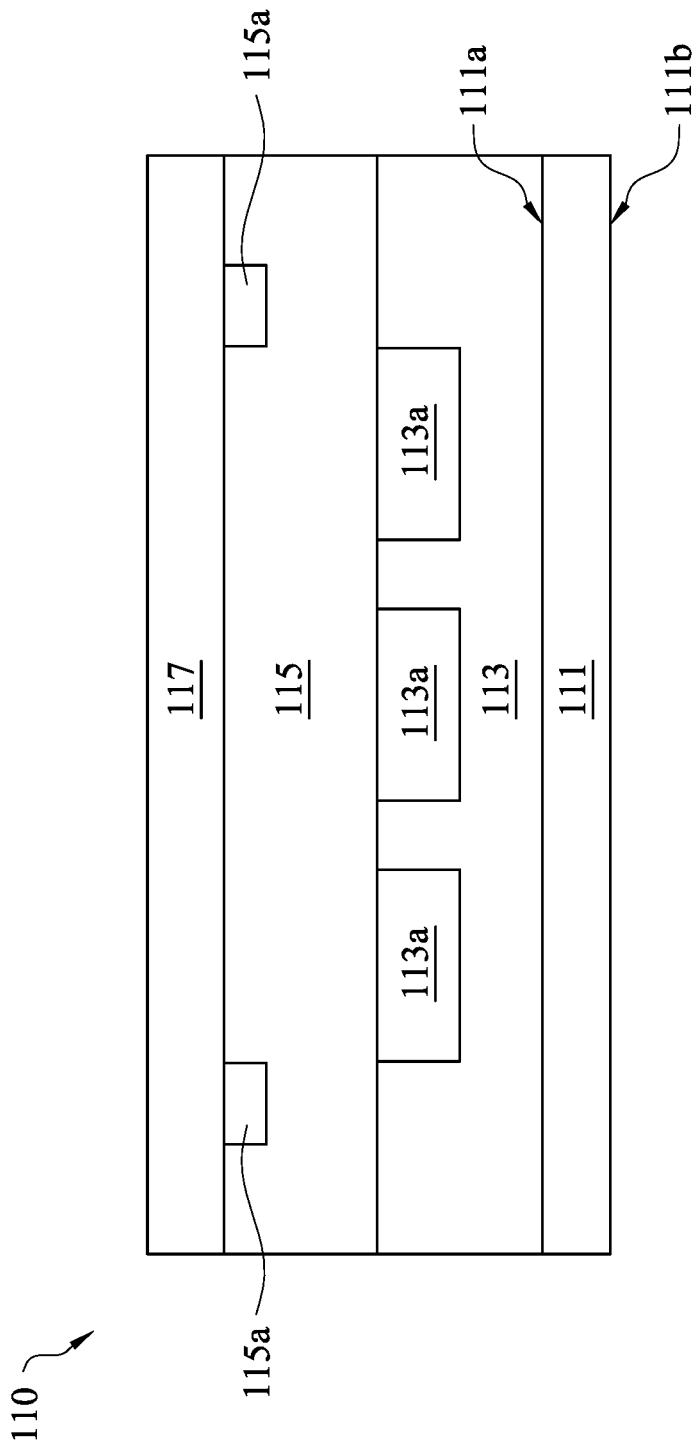
FIG. 1A and FIG. 1B are schematic cross-sectional views of a semiconductor wafer in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

Typically, a backside illumination (BSI) image sensor is fabricated by bonding a carrier wafer with an active wafer by using an oxide-to-oxide bonding operation. The active wafer includes plural light-sensitive pixel devices used to detect incident light and convert optical signals to electrical signals. An etching operation is performed to form a through via passing through the carrier wafer until an interconnect structure of the active wafer is exposed, and then a conductive material is deposited in the through via. However, the carrier wafer and the active wafer are bonded by Van Der Waals force. In the though via, a sidewall cut is likely to be formed at an interface of the carrier wafer and the active wafer during the etching operation, such that the conductive material may not completely fill the sidewall cut of the through via. Therefore, the conductive material near the interface of the carrier wafer and the active wafer in the through via may easily migrate into the sidewall cut in subsequent operations, thus affecting conducting effect.

Embodiments of the present disclosure are directed to a semiconductor device and a method for fabricating the semiconductor device, thereby preventing the conductive material in the though via from migrating, thereby overcoming conducting defects. During the etching operation and/or an ashing operation, the semiconductor device is exposed to a mixed gas, so as to form a protection layer on a sidewall of the through via. The protection layer covers the sidewall cut and the sidewall of the through via, such that the conductive material can completely fill the through via and be peripherally enclosed by the protection layer, thereby avoiding the conductive material migration in subsequent operations, further enhancing the conducting effect.

Figure 1B:
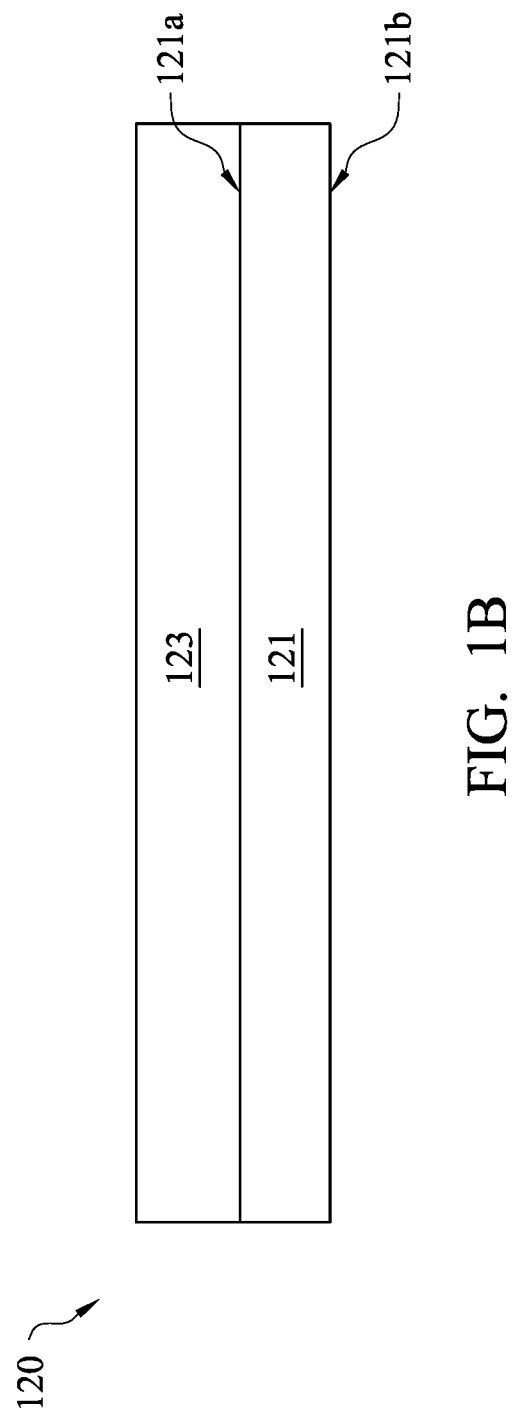

Referring to FIG. 1A to FIG. 1I. FIG. 1A and FIG. 1B are schematic cross-sectional views of a semiconductor wafer 110 and 120 in accordance with some embodiments of the present disclosure. FIG. 1C to FIG. 1I are schematic cross-sectional views of a semiconductor device 100 in accordance with some embodiments of the present disclosure. At first, as shown in FIG. 1A, the first semiconductor wafer 110 includes a first substrate 111, an image sensor device layer 113, a first interconnect layer 115, and a first oxide layer 117. In some embodiments, the first substrate 111 includes a silicon substrate or other semiconductor substrate. In some embodiments, the first substrate 111 includes bulk silicon substrate that may be undoped or doped (e.g., p-type, n-type, and/or a combination thereof). Other materials that are suitable for semiconductor device formation may be used. Other materials, such as germanium, quartz, sapphire, and glass could alternatively be used for the first substrate 111. Alternatively, the first substrate 111 may be an active layer of a semiconductor-on-insulator (SOI) substrate or a multi-layered structure such as a silicon-germanium layer formed on a bulk silicon layer.

The image sensor device layer 113 is formed on a frontside 111a of the first substrate 111. In some embodiments, the image sensor device layer 113 is formed in a portion of the first substrate 111. The image sensor device layer 113 includes plural light-sensitive pixel devices 113a. Further, the light-sensitive pixel devices 113a are configured to convert optical signals to electrical signals. In some embodiments, the image-sensitive pixel devices 113a include photo-sensitive diodes. In some embodiments, the image sensor device layer 113 further includes metal-oxide semiconductor (MOS) transistor. In some embodiments, the MOS transistor includes P-MOS transistor and N-MOS transistor respectively formed in p-wells and n-wells.

In some embodiments, a gate structure is formed on a top surface of the image sensor device layer 113. In some embodiments, the gate structure includes polysilicon, a metallic compound, a conductive alloy, a conductive polymer or another suitable gate material. In some embodiments, the gate structure is formed by a procedure including deposition, photolithography, and etch operations. In this embodiment, the deposition operation includes chemical vapor deposition (CVD), physical vapor deposition (PVD), atomic layer deposition (ALD), other suitable operations and/or a combination thereof. In this embodiment, the photolithography operation includes photoresist coating, soft baking, mask aligning, exposure, post-exposure baking, developing the photoresist, rinsing, and drying. In this embodiment, the etch operation includes wet etching, dry etching and/or other etching methods.

The first interconnect layer 115 is formed on the image sensor device layer 113. In this embodiment, the first interconnect layer 115 is a dielectric layer including interconnections. In some embodiments, the dielectric layer includes silicon oxide, silicon nitride, undoped silicate glass (USG), Boro-Silicate Glass (BSG), TEOS, other high-k dielectric materials, other low-k dielectric materials and/or a combination thereof. The first interconnect layer 115 includes plural interconnect vias, pads and channels. Plural metal pads 115a are formed in a surface of the first interconnect layer 115. In some embodiments, the interconnect vias, pads and channels and the metal pads 115 include suitable conductive materials. It should be realized that FIG. 1A is simplified to illustrate the first interconnect layer 115. Based on the ordinary knowledge, one skilled in the art can realize that the aforementioned interconnect vias, interconnect pads, interconnect channels and metal pads 115a are conducted to the gate structure, the light-sensitive pixel devices 113a and/or other semiconductor device for transmitting the signals converted by the light-sensitive pixel devices 113a.

The first oxide layer 117 is deposited on the first interconnect layer 115. In some embodiments, the first oxide layer 117 is grown by thermal grown oxide or deposited by CVD, plasma enhanced chemical vapor deposition (PECVD), PVD, other suitable operations and/or a combination thereof. In some embodiments, the first oxide layer 117 includes silicon oxide.

In some embodiments, the first semiconductor wafer 110 further includes an enhancing layer, and the enhancing layer is formed on a backside 111b of the first substrate 111. In some embodiments, the enhancing layer includes plural color filter arrays and micro-lenses. In this embodiment, the color filter arrays respectively align with corresponding light-sensitive pixel devices 113a, and the color filter arrays include red-color filter array, green-color filter array and blue-color filter. The aforementioned color filter arrays respectively allow red-light, green-light and blue-light to illuminate the corresponding one of light-sensitive pixel devices 113a. Further, the micro-lenses collect and focus lights to the corresponding color filter arrays and light-sensitive pixel devices 113a. In some embodiments, the first semiconductor wafer 110 further includes a substrate, and the substrate is disposed on a backside of the enhancing layer, so as to protect the light-sensitive pixel devices 113a. In this embodiment, the substrate covers the backside of the enhancing layer. Alternatively, the substrate is made from a transparent material to allow lights to illuminate and to be collected by the micro-lenses. In some embodiments, the first substrate 111 includes glass.

As shown in FIG. 1B. The second semiconductor wafer 120 includes a second substrate 121 and a second oxide layer 123. In some embodiments, the second substrate 121 includes a silicon substrate or other semiconductor substrate. In some embodiments, the second substrate 121 may be the same as the first substrate 111. In some embodiments, the second substrate 121 includes a suitable elemental semiconductor, such as germanium or diamond; a suitable compound semiconductor, such as silicon carbide, gallium nitride, gallium arsenide, or indium phosphide; or a suitable alloy semiconductor, such as silicon germanium, silicon tin, aluminum gallium arsenide, or gallium arsenide phosphide. In some embodiments, the second substrate 121 includes other carrier substrates, such as glass substrate and ceramic substrate.

The second oxide layer 123 is deposited on a frontside 121a of the second substrate 121. In some embodiments, the second oxide layer 123 is grown by thermal grown oxide or deposited by CVD, PECVD, PVD, other suitable operations and/or a combination thereof. In some embodiments, the second oxide layer 123 is formed by the same operation as the first oxide layer 117 (shown as in FIG. 1A). In some embodiments, the second oxide layer 123 includes silicon oxide.

In some embodiments, the second semiconductor wafer 120 further includes a second interconnect layer, and the second interconnect layer is disposed between the second oxide layer 123 and the second substrate 121. In some embodiments, the second interconnect layer is a dielectric layer including interconnections. In some embodiments, the dielectric layer includes silicon oxide, silicon nitride, undoped silicate glass (USG), Boro-Silicate Glass (BSG), TEOS, other high-k dielectric materials, other low-k dielectric materials and/or a combination thereof. The second interconnect layer includes plural interconnect vias, pads and channels. In some embodiments, the interconnect vias, pads and channels include suitable conductive materials. In some embodiments, the second interconnect layer includes an Application Specific Integrated Circuit (ASIC).

Figure 1C:
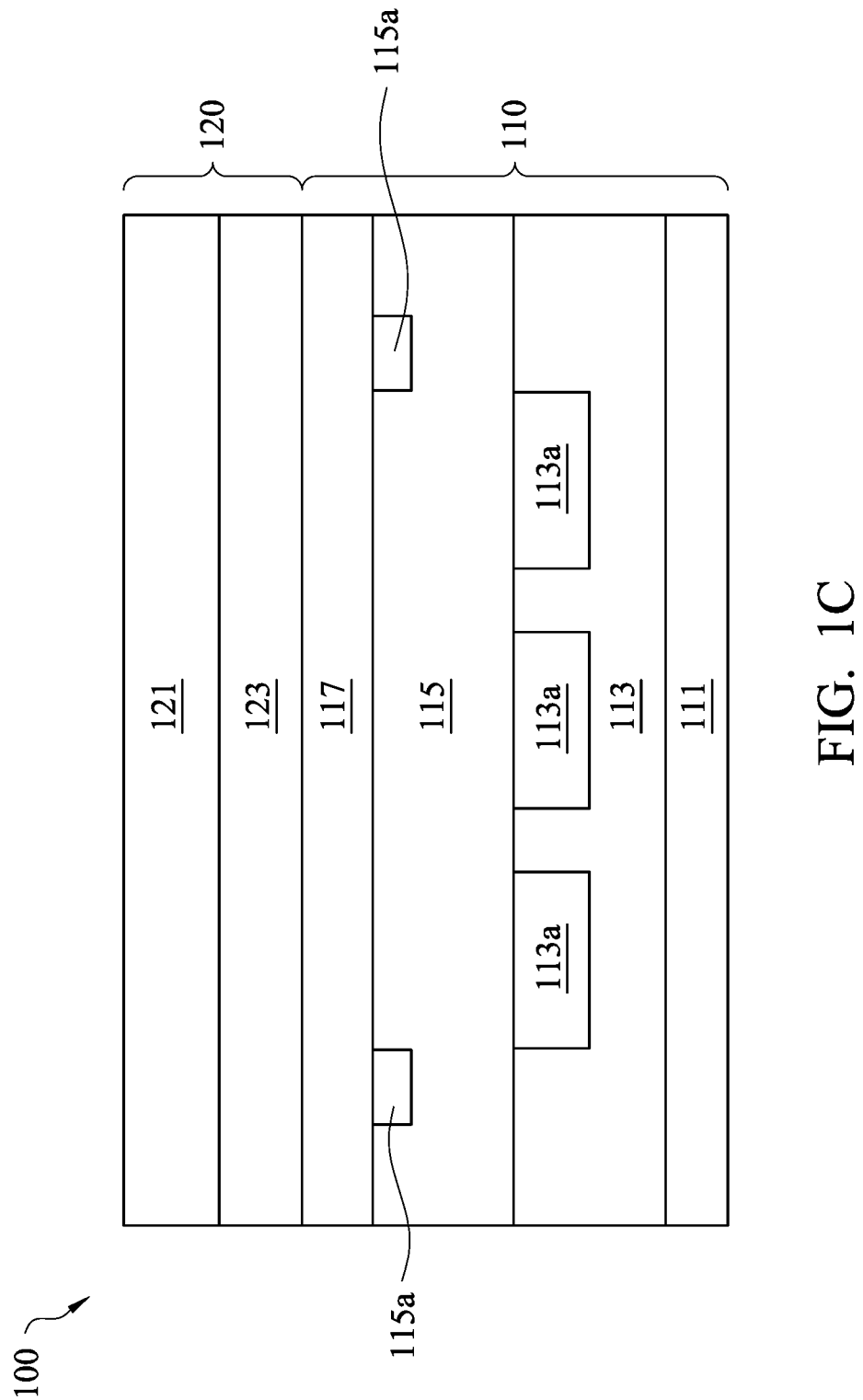
FIG. 1C to FIG. 1I are schematic cross-sectional views of a semiconductor device in accordance with some embodiments of the present disclosure.
Figure 1D:
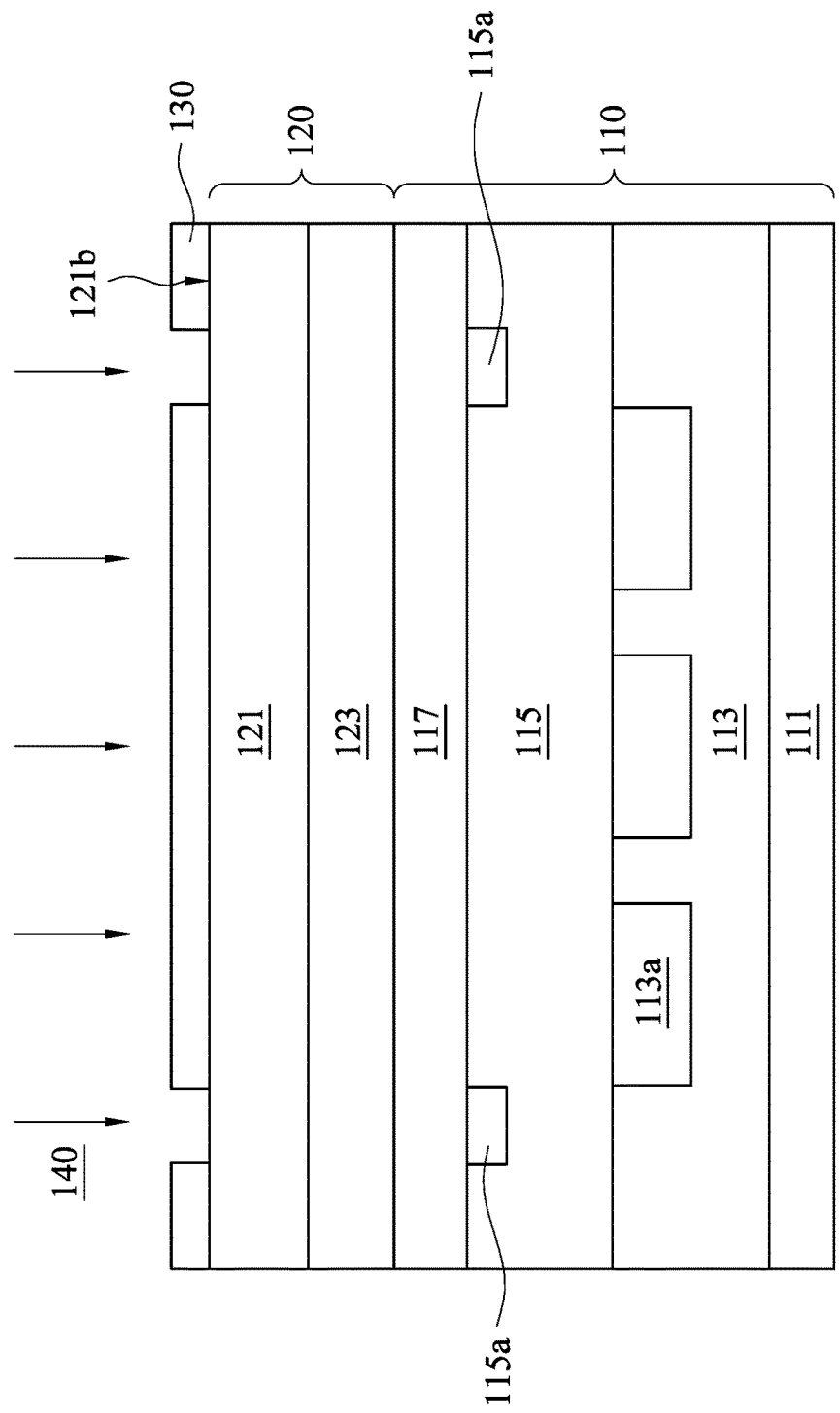
Figure 1E:
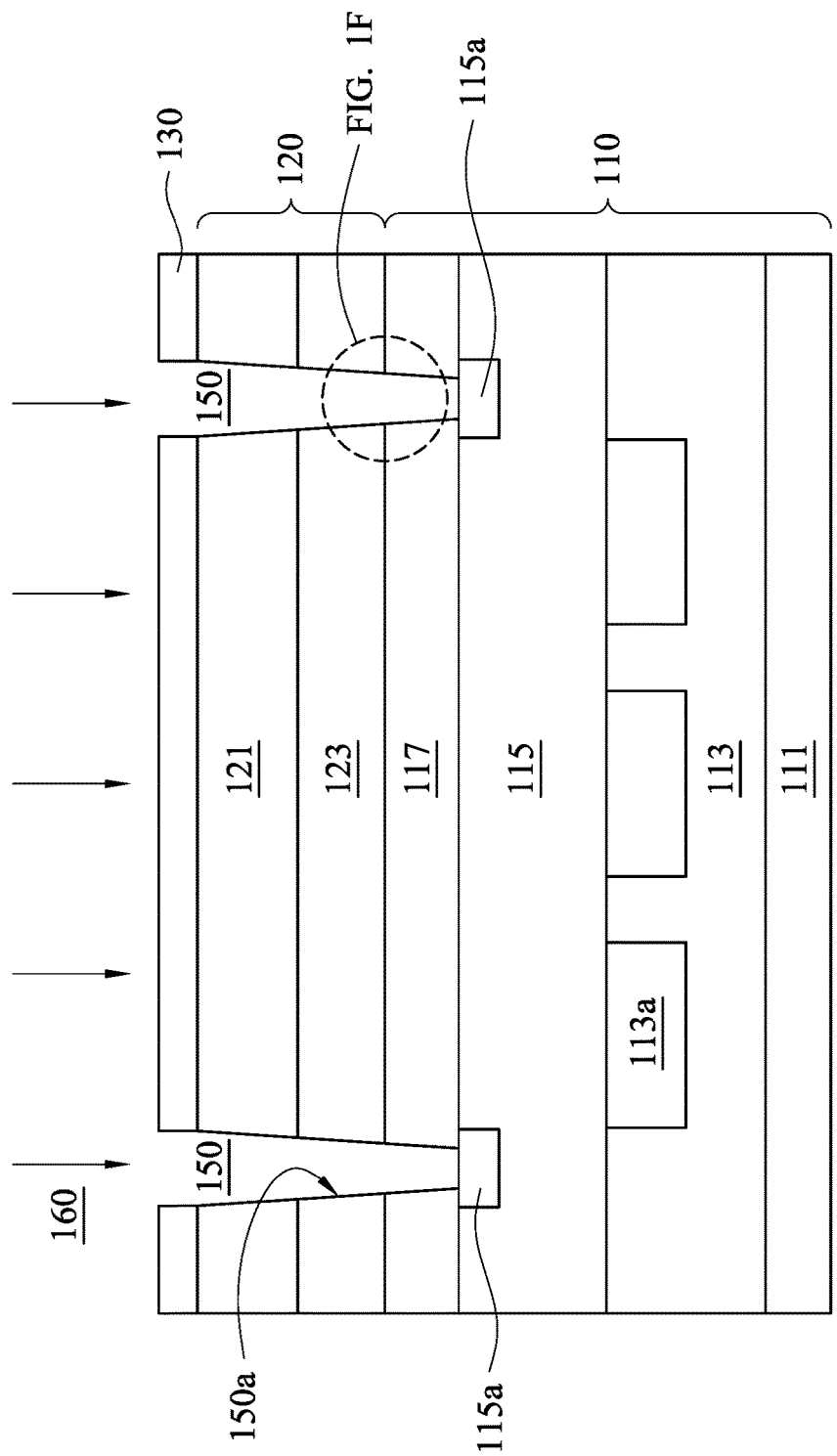

As shown in FIG. 1C to FIG. 1E. The second oxide layer 123 of the second semiconductor wafer 120 is bonded with the first oxide layer 117 of the first semiconductor wafer 110 by Van Der Waals force, so as to form a semiconductor device 100. A photoresist 130 is formed on a backside 121b of the second substrate 121, and the photoresist 130 is patterned to form an anticipative pattern by performing a photolithography operation, such that a portion of the backside 121b of the second substrate 121 is exposed. The exposed backside 121b of the second substrate 121 is subjected to an operation of forming a through via 150 by using a bombarding gas 140. The bombarding gas 140 is used to bombard the exposed backside 121b of the second substrate 121 so as to form the through via 150. In some embodiments, the operation of forming the through via 150 is performed by an etching operation. In some embodiments, the bombarding gas 140 includes oxygen gas.

As shown in FIG. 1E. The through via 150 passes through the second substrate 121, the second oxide layer 123 and the first oxide layer 117 until the metal pad 115a of the interconnect layer 115 is exposed. Referring to FIG. 1E together with FIG. 1F, a sidewall cut 140a is formed on a sidewall 150a of the through via 150 at an interface of the first oxide layer 117 and the second oxide layer 123. For example, a depth of the sidewall cut 140a is in a range substantially from 16 nm to 18 nm in some embodiments.

Further, after the operation of forming the through via 150 is performed, the semiconductor device 100 generally is immersed into a treating solution (e.g. an acidic solution, an alkaline solution or a combination thereof) to remove undesired byproducts formed during the operation of forming the through via 150. Therefore, while the semiconductor device 100 is immersed into the treating solution, the treating solution permeates into the interface, so as to enlarge the sidewall cut 140a. In some embodiments, the treating solution includes commercial products, such as ST-250™ cleaning solution.

In addition, a silicon carbide is deposited on the sidewall of the through via 150 in some embodiments. In some embodiments, a thickness of the silicon carbide is in a range substantially from 40 Å to 50 Å. Therefore, when the sidewall cut 140a is much larger (i.e. the sidewall cut 140a becomes much wider and deeper), a morphology of the silicon carbide is worse.

Figure 1F:
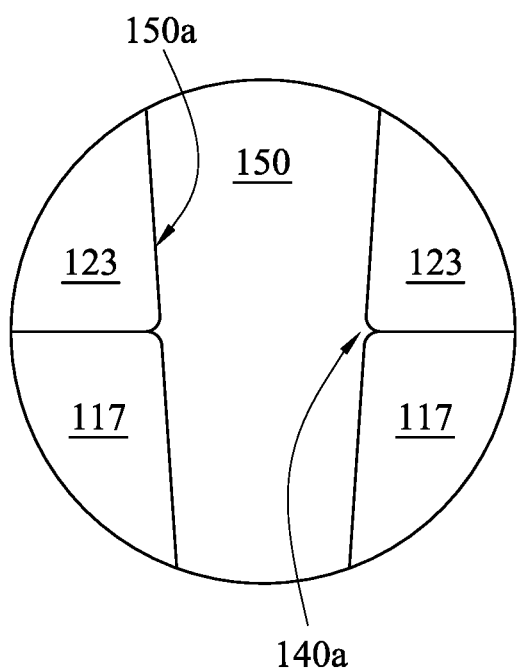
Figure 1G:
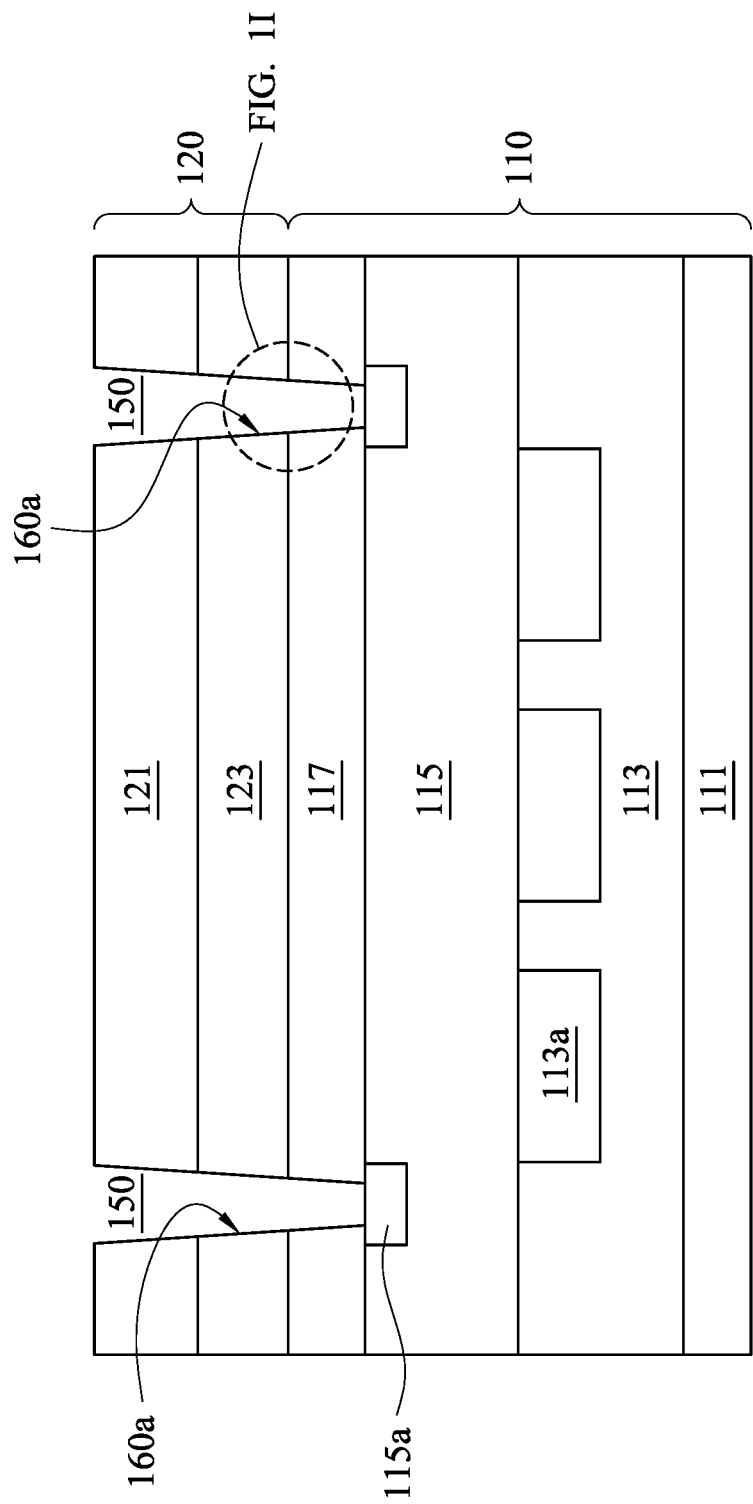

As shown in FIG. 1E and FIG. 1G. the semiconductor device 100 is subjected to an ashing operation by using a mixed gas 160, so as to remove the photoresist 130 and residues generated when forming the through via 150. In some embodiments, the mixed gas includes oxygen gas. In some embodiments, the mixed gas includes oxygen gas and nitrogen gas. In this embodiment, an amount of the oxygen gas is more than an amount of the nitrogen gas. In some embodiments, a ratio of the oxygen gas and the nitrogen gas is substantially larger than 5:1. In some embodiments, the ratio of the oxygen gas and the nitrogen gas is in a range substantially from 5:1 to 10:1. During the ashing operation, the mixed gas reacts with the first oxide layer 117 and the second oxide layer 123, so as to form a protection layer 160a on the sidewall of the through via 150. The protection layer 160a covers the sidewall cut 140a, and the protection layer 160a is peripherally enclosed by the second substrate 121, the second oxide layer 123 and the first oxide layer 117. Referring to FIG. 1G together with FIG. 1H. The protection layer 160a near the interface of the first oxide layer 117 and the second oxide layer 123 is flat. In some embodiments, the protection layer 160a includes SiON, SiN or a combination thereof. As such, the protection layer 160a may be a hard mask to prevent the sidewall cut 140a from being enlarged in subsequent operations. In some embodiments, the protection layer 160a includes 13 at % to 17 at % of N atoms. In some embodiments, a ratio of Si atoms, O atoms and N atoms in the protection layer 160a is 8:3:2. In some embodiments, the protection layer 160a includes 52 at % to 68 at % of Si atoms, 19.5 at % to 25.5 at % of O atoms and 13 at % to 17 at % of N atoms.

Figure 1H:
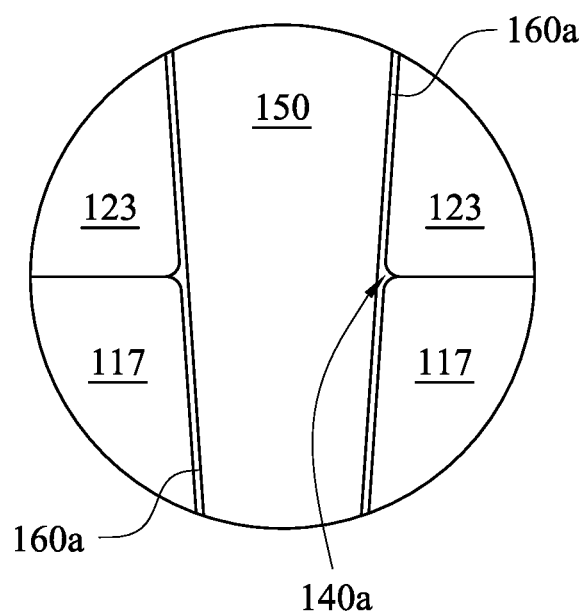
Figure 1I:
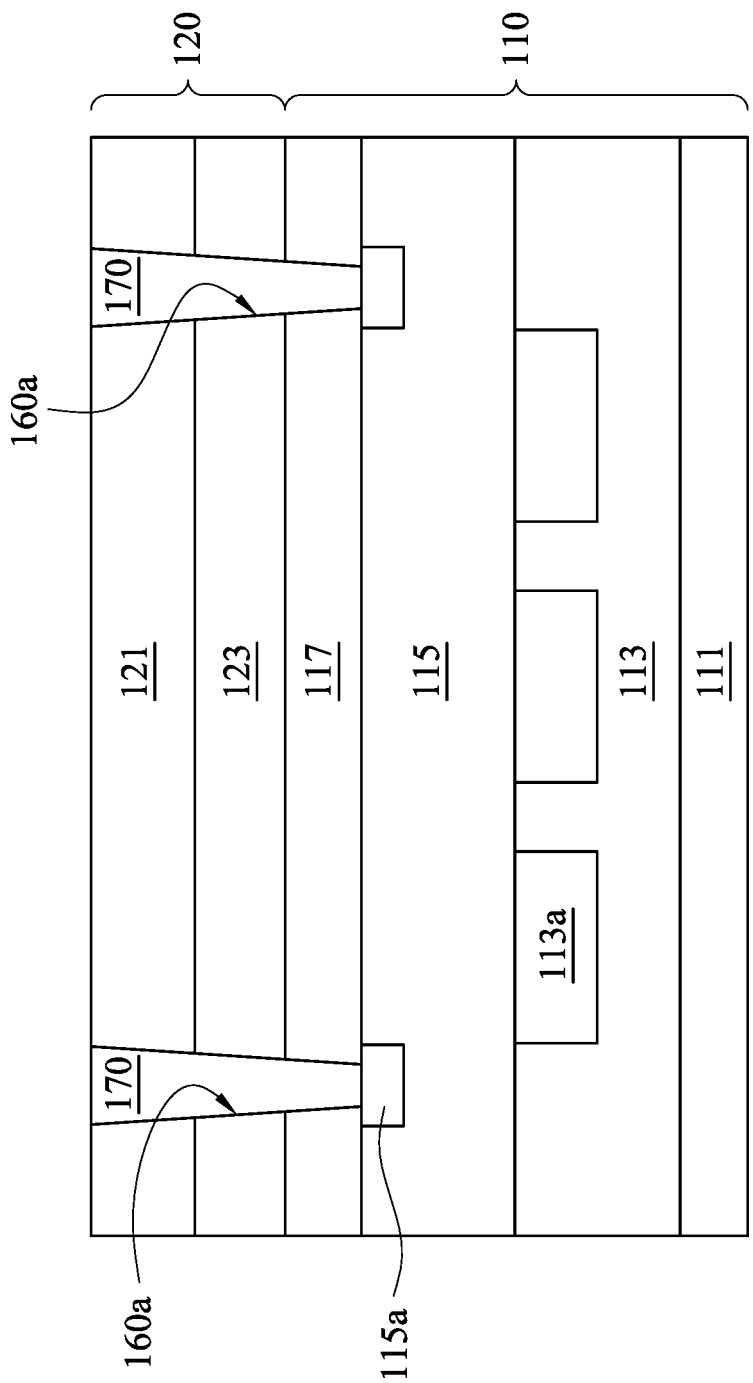

As shown in FIG. 1I. A conductive material is deposited in the though via 150 to form a conductive via 170 peripherally enclosed by the protection layer 160, so as to conduct the metal pad 115a. In some embodiments, the conductive material includes copper, other suitable conductive material and/or a combination thereof. When the operation of depositing the conductive material is performed, the conductive material can be uniformly deposited in the through via 150 due to the protection layer 160 which covers the sidewall of the through via 150 and the sidewall cut 140a. As such, the conductive material may completely fill the through via 150 without needing to fill the sidewall cut 140a. In some embodiments, after the operation of depositing the conductive material is performed, the semiconductor device 100 is subjected to heat in subsequent operations. Because the conductive material has completely filled the through via 150, the conductive material migration will not occur, such that the conductive via 170 can be effectively electrically connected to the metal pad 115a.

Figure 2A:
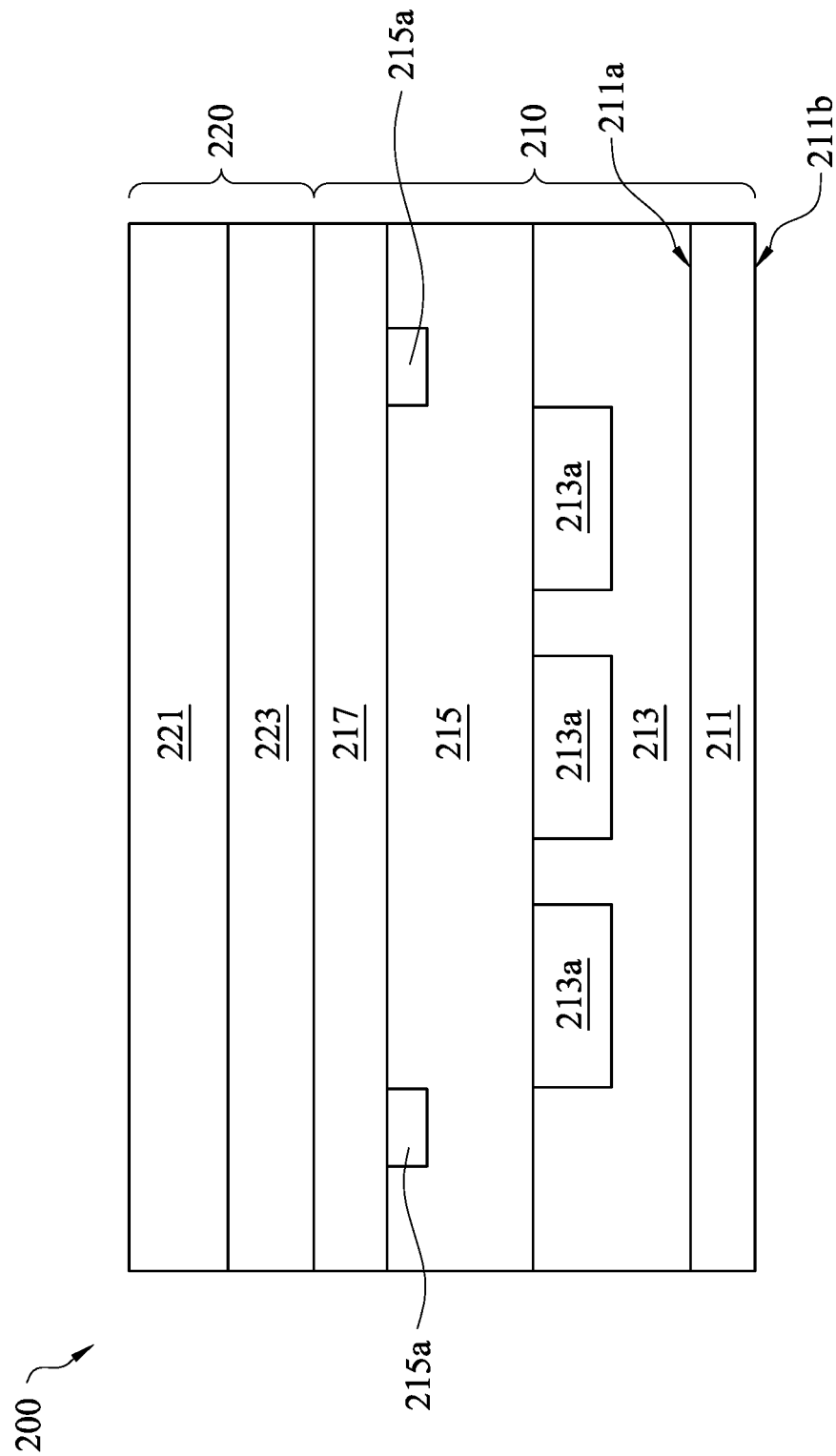
FIG. 2A to FIG. 2F are schematic cross-sectional views of a semiconductor device in accordance with some embodiments of the present disclosure.

Referring to FIG. 2A to FIG. 2F. FIG. 2A to FIG. 2F are schematic cross-sectional views of a semiconductor device 200 in accordance with some embodiments of the present disclosure. As shown in FIG. 2A, the semiconductor device 200 includes a first semiconductor wafer 210 and a second semiconductor wafer 220, and the second semiconductor wafer 220 is bonded with the first semiconductor wafer 210 by the oxide-to-oxide bonding operation.

The semiconductor wafer 210 includes a first substrate 211, an image sensor device layer 213, a first interconnect layer 215, and a first oxide layer 217. The image sensor device layer 213 is formed on the first substrate 211, and the image sensor device layer 213 includes plural light-sensitive pixel devices 213a. In some embodiments, the image sensor device layer 213 is formed in a portion of the first substrate 211. In some embodiments, the image-sensitive pixel devices 213a include photo-sensitive diodes. In some embodiments, a gate structure is formed on a top surface of the image sensor device layer 213. The first interconnect layer 215 is formed on the image sensor device layer 213. In this embodiment, the first interconnect layer 215 is a dielectric layer with plural interconnect vias, pads and channels. Metal pads 215a are formed in a surface of the first interconnect layer 215. The first oxide layer 217 is deposited on the first interconnect layer 215. In some embodiments, the first oxide layer 217 includes silicon oxide.

In some embodiments, the first semiconductor wafer 210 further includes an enhancing layer, and the enhancing layer is formed on a backside 111b of the first substrate 111. In some embodiments, the enhancing layer includes plural color filter arrays and micro-lenses. In this embodiment, the color filter arrays respectively align with corresponding light-sensitive pixel devices 113a. In some embodiments, the first semiconductor wafer 110 further includes a substrate, and the substrate is disposed on a backside of the enhancing layer, so as to protect the light-sensitive pixel devices 113a. In this embodiment, the substrate is made from a transparent material to allow lights to illuminate and to be collected by the micro-lenses. In some embodiments, the first substrate 111 includes glass.

The second semiconductor wafer 220 includes a second substrate 221 and a second oxide layer 223. The second oxide layer 223 is deposited on a frontside 211a of the second substrate 221. In some embodiments, the second oxide layer 223 includes silicon oxide. In some embodiments, the second semiconductor wafer 220 further includes a second interconnect layer, and the second interconnect layer is disposed between the second oxide layer 223 and the second substrate 221. In some embodiments, the second interconnect layer is a dielectric layer including plural interconnect vias, pads and channels. In some embodiments, the second interconnect layer includes an Application Specific Integrated Circuit (ASIC).

Figure 2B:
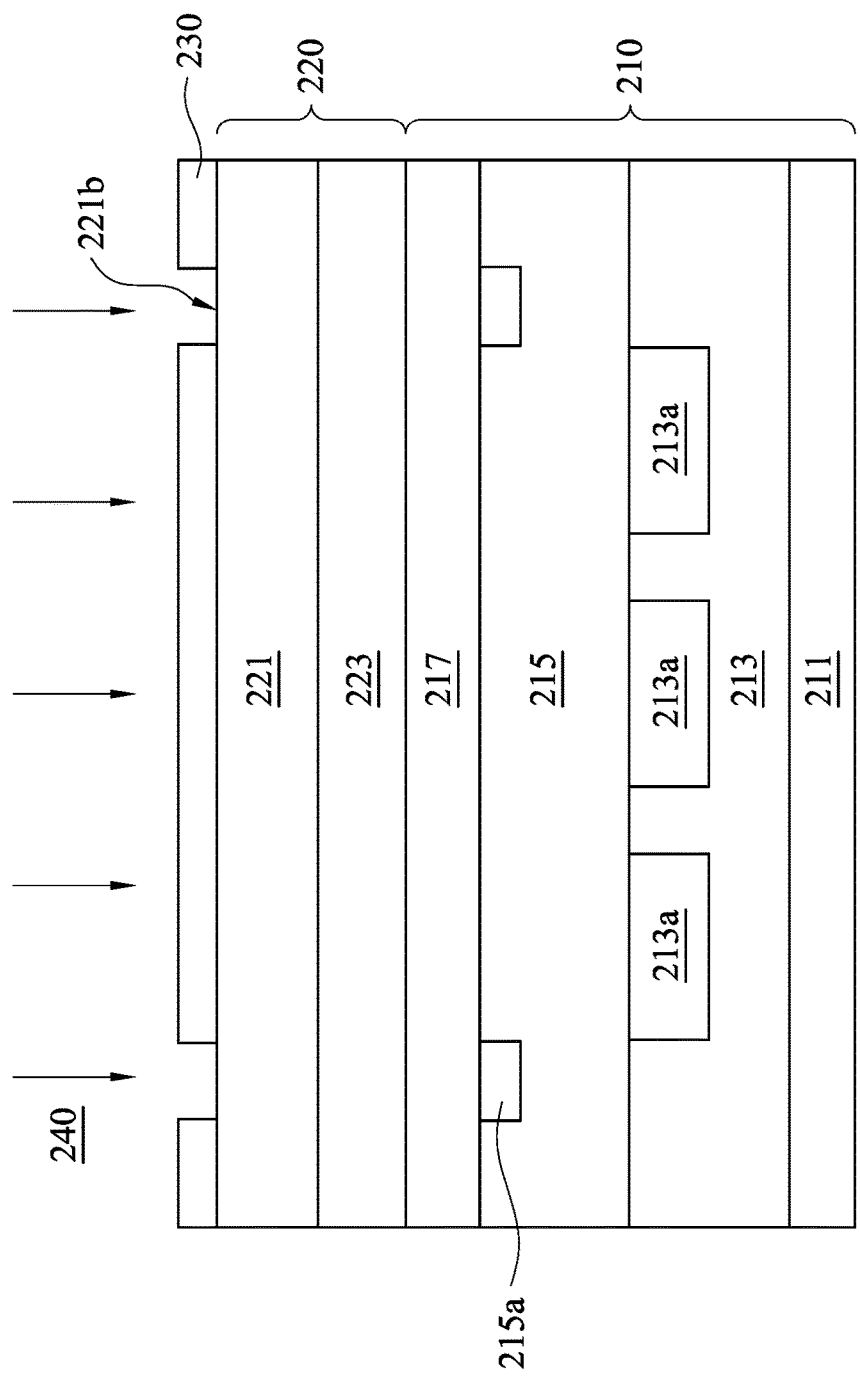
Figure 2C:
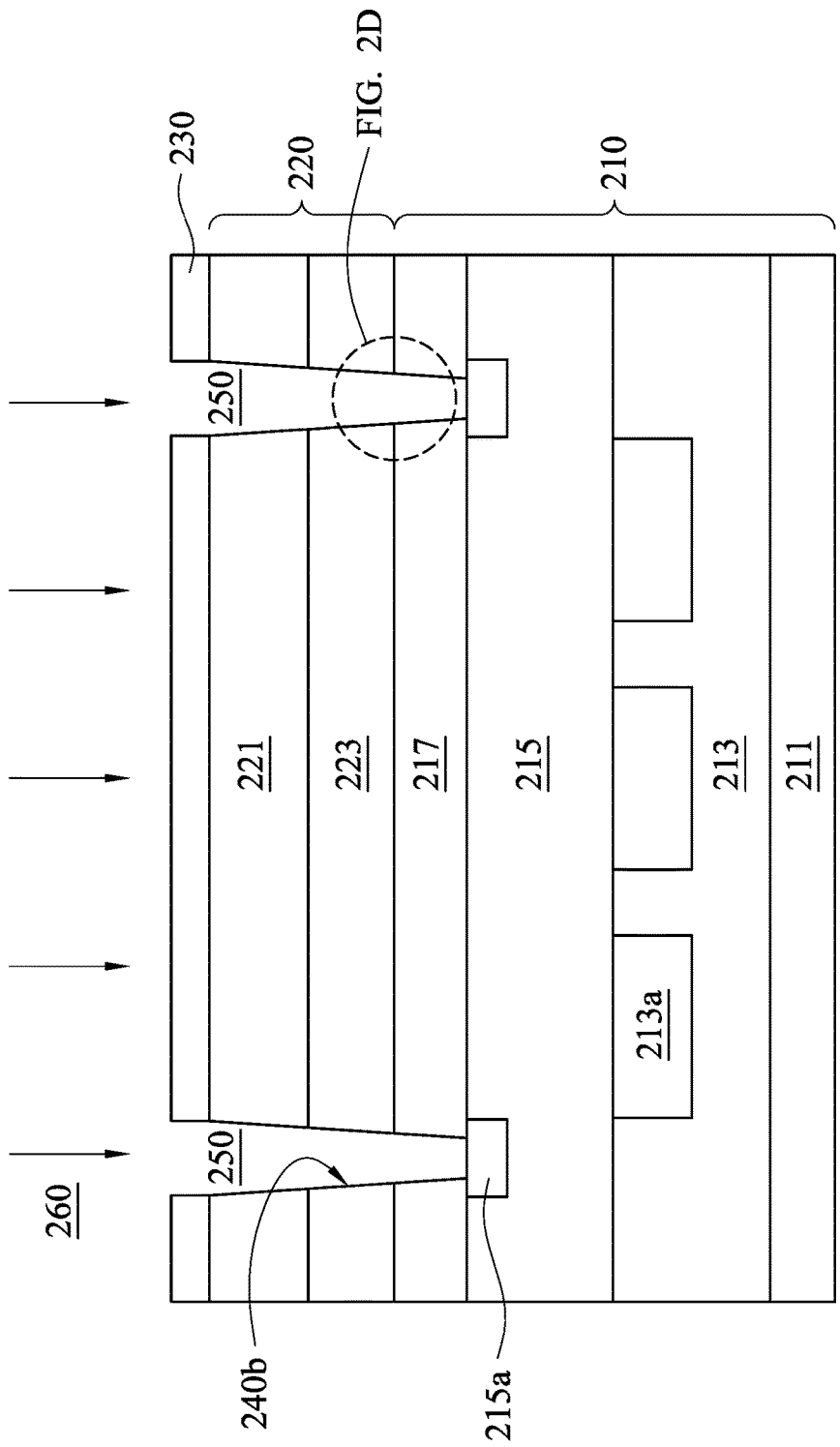
Figure 2D:
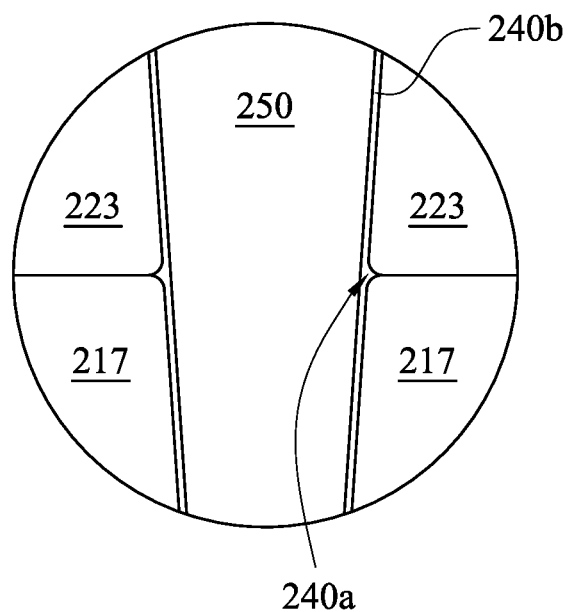

As shown in FIG. 2B and FIG. 2C. A photoresist 230 is formed on a backside 221b of the second substrate 221, and the photoresist 230 is patterned to form an anticipative pattern by performing a photolithography operation, so as to expose a portion of the backside 221b of the second substrate 221. Then, the exposed backside 221b of the second substrate 221 is bombarded by a bombarding gas 240, so as to form a through via 250. In some embodiments, the bombarding gas 240 includes oxygen gas. In some embodiments, the bombarding gas 240 includes oxygen gas and nitrogen gas. In this embodiment, an amount of the oxygen gas is more than an amount of the nitrogen gas. In some embodiments, a ratio of the oxygen gas and the nitrogen gas is substantially larger than 5:1. In some embodiments, the ratio of the oxygen gas and the nitrogen gas is in a range substantially from 5:1 to 10:1.

As shown in FIG. 2C. The through via 250 passes through the second substrate 221, the second oxide layer 223 and the first oxide layer 217 until the metal pads 215a of the interconnect layer 215 is exposed. Referring to FIG. 2C together with FIG. 2D, a sidewall cut 240a is formed on a sidewall of the through via 250 at an interface of the first oxide layer 217 and the second oxide layer 223. For example, a depth of the sidewall cut 240a is in a range substantially from 16 nm to 18 nm in some embodiments. During the bombarding operation, the bombarding gas 240 reacts with the first oxide layer 217 and the second oxide layer 223, so as to form a protection layer 240b on the sidewall of the through via 250, and the protection layer 260b covers the sidewall cut 240a. The protection layer 240b is peripherally enclosed by the second substrate 221, the second oxide layer 223 and the first oxide layer 217, and the protection layer 240b near the interface of the first oxide layer 217 and the second oxide layer 223 is flat. In some embodiments, the protection layer 240b includes SiON, SiN and/or a combination thereof. As such, the protection layer 240b may be a hard mask to prevent the sidewall cut 240a from being enlarged by subsequent operations. In some embodiments, the protection layer 240b includes 13 at % to 17 at % of N atoms. In some embodiments, a ratio of Si atoms, O atoms and N atoms in the protection layer 240b is 8:3:2. In some embodiments, the protection layer 240b includes 52 at % to 68 at % of Si atoms, 19.5 at % to 25.5 at % of O atoms and 13 at % to 17 at % of N atoms.

Figure 2E:
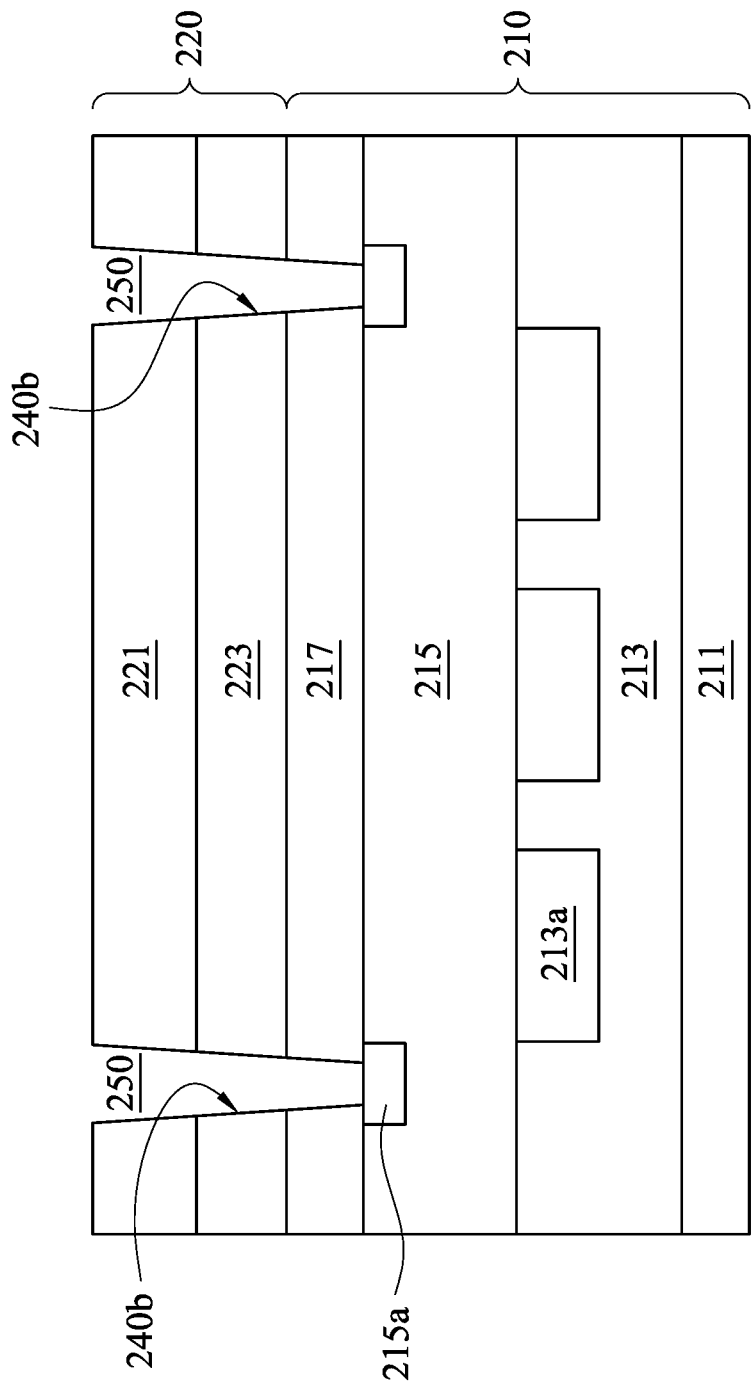
Figure 2F:
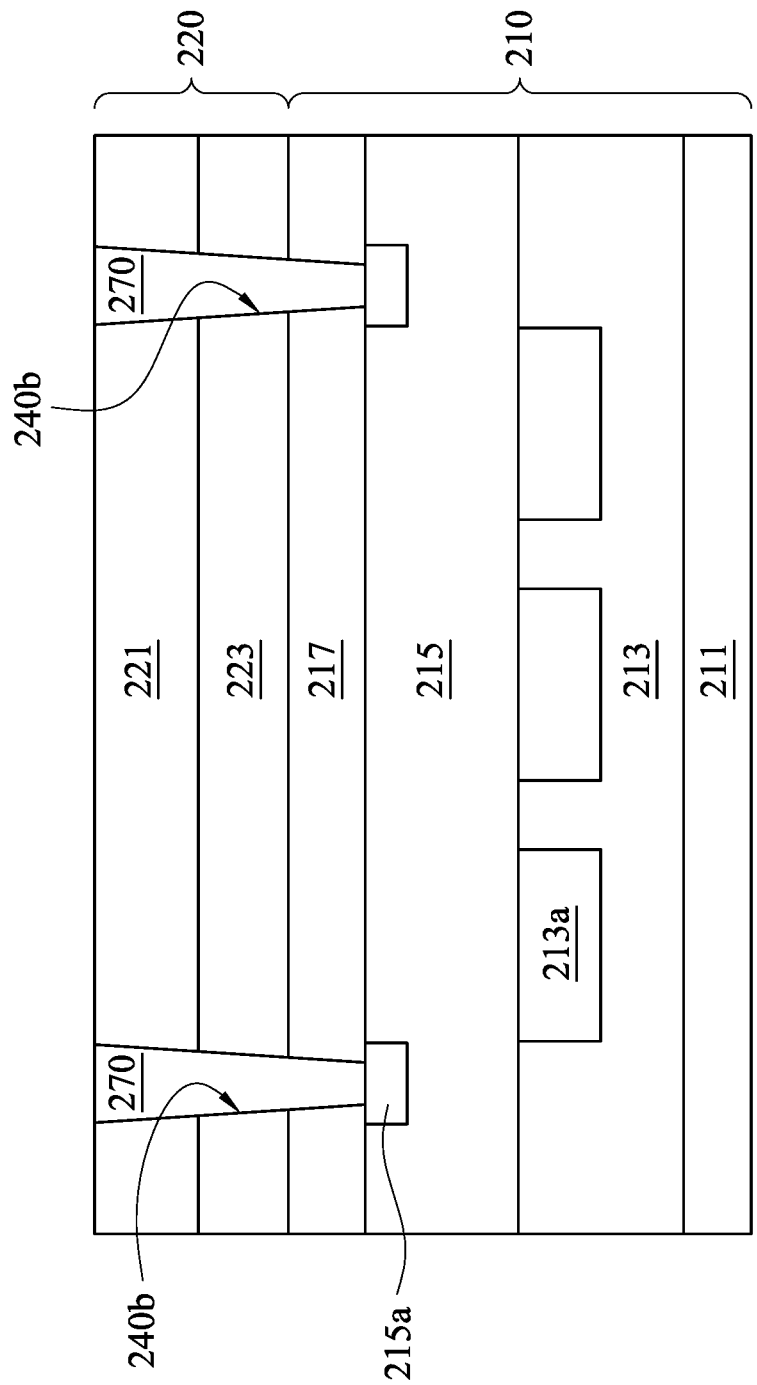

As shown in FIG. 2C and FIG. 2E. the semiconductor device 200 is subjected to an ashing operation by using an ashing gas 260, so as to remove the photoresist 230 and residues generated when forming the through via 250. In some embodiments, the ashing gas includes oxygen gas. As shown in FIG. 2E, a conductive material is deposited in the though via 250 to form a conductive via 270 peripherally enclosed by the protection layer 240b, so as to conduct the metal pad 215a. In some embodiments, the conductive material includes copper, other suitable conductive material and/or a combination thereof. When the operation of depositing the conductive material is performed, the conductive material can be uniformly deposited in the through via 250 due to the protection layer 240b which covers the sidewall of the through via 250 and the sidewall cut 240a. Thus, the conductive material may completely fill the through via 250 without needing to fill the sidewall cut 240a. In some embodiments, after the operation of depositing the conductive material is performed, the semiconductor device 200 is subjected to heat in the subsequent operation. Because the conductive material has completely filled the through via 250, the conductive material migration can be prevented, such that the conductive via 270 can be effectively conducted to the metal pad 215a.

Figure 3:
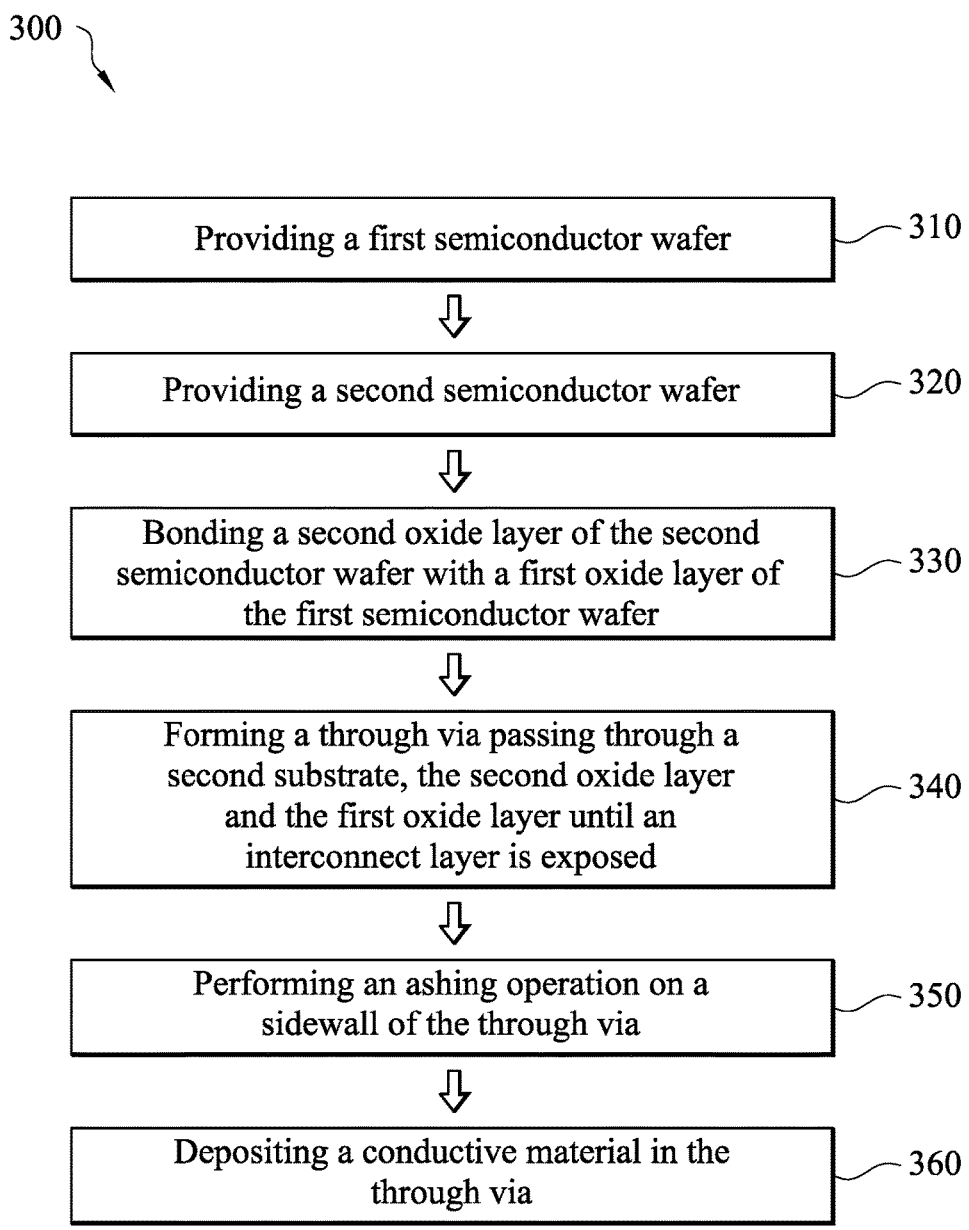
FIG. 3 is a flow chart showing a method for fabrication a semiconductor device according to some embodiments of the present disclosure.

Referring to FIG. 3 together with FIG. 1A to FIG. 1I. FIG. 3 is a flow chart showing a method 300 for fabrication a semiconductor device 100 according to some embodiments of the present disclosure.

At operation 310, a first semiconductor wafer 110 is provided. As shown in FIG. 1A, the first semiconductor wafer 110 includes a first substrate 111, an image sensor device layer 113, a first interconnect layer 115, and a first oxide layer 117. The image sensor device layer 113 is formed on a frontside 111a of the first substrate 111. In some embodiments, the image sensor device layer 113 is formed in a portion of the first substrate 111. The image sensor device layer 113 includes plural light-sensitive pixel devices 113a. In some embodiments, the image-sensitive pixel devices 113a include photo-sensitive diodes. In some embodiments, a gate structure is formed on a top surface of the image sensor device layer 113. The first interconnect layer 115 is formed on the image sensor device layer 113. In this embodiment, the first interconnect layer 115 is a dielectric layer including plural interconnect vias, pads and channels. Plural metal pads 115a are formed in a surface of the first interconnect layer 115. The first oxide layer 117 is deposited on the first interconnect layer 115.

In some embodiments, the first semiconductor wafer 110 further includes an enhancing layer, and the enhancing layer is formed on a backside 111b of the first substrate 111. In some embodiments, the enhancing layer includes plural color filter arrays and micro-lenses. In this embodiment, the color filter arrays include red-color filter array, green-color filter array and blue-color filter, and respectively allow red-light, green-light and blue-light to illuminate the corresponding one of light-sensitive pixel devices 113a. Further, the micro-lenses collect and focus lights to the corresponding color filter arrays and light-sensitive pixel devices 113a. In some embodiments, the first semiconductor wafer 110 further includes a substrate, and the substrate is disposed on a backside of the enhancing layer, so as to protect the light-sensitive pixel devices 113a, the color filter arrays and the micro-lenses. In some embodiments, the substrate is made from a transparent material to allow lights to illuminate and to be collected by the micro-lenses. In some embodiments, the first substrate 111 includes glass.

At operation 320, a second semiconductor wafer 120 is provided. As shown in FIG. 1B, the second semiconductor wafer 120 includes a second substrate 121 and a second oxide layer 123. The second oxide layer 123 is deposited on a frontside 121a of the second substrate 121. In some embodiments, the second oxide layer 123 includes silicon oxide.

In some embodiments, the second semiconductor wafer 120 further includes a second interconnect layer, and the second interconnect layer is disposed between the second oxide layer 123 and the second substrate 121. In some embodiments, the second interconnect layer is a dielectric layer including interconnect vias, pads and channels. In some embodiments, the second interconnect layer includes an Application Specific Integrated Circuit (ASIC).

At operation 330, the second oxide layer 123 of the second semiconductor wafer 120 is bonded with the first oxide layer 117 of the first semiconductor wafer 110, as shown in FIG. 1C. The first semiconductor wafer 110 and the second semiconductor wafer 120 are bonded by an oxide-oxide bonding operation, so as to form a semiconductor device 100.

At operation 340, the semiconductor device 100 is subject to an operation of forming a through via 150, as shown in FIG. 1D and FIG. 1E. At first, a patterned photoresist 130 is formed on a backside 121b of the second substrate 121, such that a portion of the backside 121b of the second substrate 121 is exposed. The exposed portion of the backside 121b of the second substrate 121 is subjected to the operation by using a bombarding gas 140. In some embodiments, the operation of forming the through via 150 is performed by an etching operation. In this embodiment, the bombarding gas 140 includes oxygen gas. The formed through via 150 passes through the second substrate 121, the second oxide layer 123 and the first oxide layer 117 until the metal pad 115a of the interconnect layer 115 is exposed. Referring to FIG. 1E and FIG. 1F, a sidewall cut 140a is formed on a sidewall 150a of the through via 150 at an interface of the first oxide layer 117 and the second oxide layer 123.

In some embodiments, after the operation of forming the through via 150 is performed, the semiconductor device 100 generally is further immersed into a treating solution (e.g. an acidic solution, an alkaline solution or a combination thereof) to remove undesired byproducts formed during the operation of forming the through via 150. Therefore, while the semiconductor device 100 is immersed into the treating solution, the sidewall cut 140a may be enlarged. Further, a silicon carbide film is deposited on the sidewall of the through via 150 in some embodiments. In some embodiments, a thickness of the silicon carbide film is in a range substantially from 40 Å to 50 Å. Therefore, if the sidewall cut 140a is much larger (i.e. the sidewall cut 140a becomes much wider and deeper), the silicon carbide film cannot be well deposited on the sidewall of the through via 150, so as to affect a morphology of the silicon carbide film.

At operation 350, the semiconductor device 100 is subjected to an ashing operation by using a mixed gas 160 including oxygen gas, and to remove the photoresist 130 and residues generated when forming the through via 150, as shown in FIG. 1E and FIG. 1G. When the mixed gas is introduced into the through via 150, the mixed gas reacts with the first oxide layer 117 and the second oxide layer 123, so as to form a protection layer 160a on the sidewall of the through via 150. The protection layer 160a is peripherally enclosed by the second substrate 121, the second oxide layer 123 and the first oxide layer 117, and the protection layer 160a covers the sidewall cut 140a, as shown in FIG. 1H. The protection layer 160a near the interface of the first oxide layer 117 and the second oxide layer 123 is flat. In some embodiments, the mixed gas includes oxygen gas and nitrogen gas. In this embodiment, an amount of the oxygen gas is more than an amount of the nitrogen gas. In some embodiments, a ratio of the oxygen gas and the nitrogen gas is substantially larger than 5:1. In some embodiments, the ratio of the oxygen gas and the nitrogen gas is in a range substantially from 5:1 to 10:1. In some embodiments, the protection layer 160a includes SiON, SiN or a combination thereof. As such, the protection layer 160a may be a hard mask to prevent the sidewall cut 140a from being enlarged in subsequent operations. In some embodiments, the protection layer 160a includes 13 at % to 17 at % of N atoms. In some embodiments, a ratio of Si atoms, O atoms and N atoms in the protection layer 160a is 8:3:2. In some embodiments, the protection layer 160a includes 52 at % to 68 at % of Si atoms, 19.5 at % to 25.5 at % of O atoms and 13 at % to 17 at % of N atoms.

At operation 360, a conductive material is deposited in the through via 150, so as to form a conductive via 170 peripherally enclosed by the protection layer 160a, as shown in FIG. 1G and FIG. 1I. The conductive via 170 conducts the metal pad 115a. In some embodiments, the conductive material includes copper, other suitable conductive material and/or a combination thereof. Because the protection layer 160 covers the sidewall of the through via 150 and the sidewall cut 140a, the conductive material can uniformly be deposited in the through via 150. Therefore, the conductive material may well fill the through via 150 without needing to fill the sidewall cut 140a. In some embodiments, when the semiconductor device 100 is subjected to heat in subsequent operations, the well deposited conductive material can prevent from migrating, so as to solve the interface defects.

In some embodiments, the operation of forming the through via 150 is performed by the etching operation with the bombarding gas 140 including oxygen gas and nitrogen gas during operation 340. In this embodiment, an amount of the oxygen gas is more than an amount of the nitrogen gas. In some embodiments, a ratio of the oxygen gas and the nitrogen gas is substantially larger than 5:1. In some embodiments, the ratio of the oxygen gas and the nitrogen gas is in a range substantially from 5:1 to 10:1. When the aforementioned etching operation is performed by using the bombarding gas 140 including the oxygen gas and the nitrogen gas, a protection layer is formed on the sidewall of the through via 150. In this embodiment, the protection layer includes SiON, SiN and/or a combination thereof. In some embodiments, the protection layer includes 13 at % to 17 at % of N atoms. In some embodiments, a ratio of Si atoms, O atoms and N atoms in the protection layer is 8:3:2. In some embodiments, the protection layer includes 52 at % to 68 at % of Si atoms, 19.5 at % to 25.5 at % of O atoms and 13 at % to 17 at % of N atoms. When the operation of forming the through via 150 is performed by using the oxygen gas and the nitrogen gas, the following ashing operation is performed by using oxygen gas during operation 350, so as to remove the photoresist 130.

According to the aforementioned embodiments of the present disclosure. An ashing operation is performed on a sidewall of the through via to form a protection layer on the sidewall of the through via for covering a sidewall cut of the through via at an interface of a first oxide layer and a second oxide layer and enabling a conductive material to completely fill in the through via to form a conductive via, thus preventing the conductive via from the defects of conductive material migration in subsequent operations.

It is noted that the semiconductor device and the method for fabricating thereof is not limited to the above embodiments of present disclosure. The semiconductor device and the method for fabricating thereof can be applied in enhancing the deposition effect of the conductive material.

In accordance with an aspect of the present disclosure, the present disclosure discloses a semiconductor device. The semiconductor device comprises an image sensor device layer, a first bonding layer over the image sensor device layer, a second bonding layer bonded with the first bonding layer, a substrate over the second bonding layer and a conductive via passing through the substrate, the second bonding layer, and the first bonding layer. The conductive via comprises a protection layer and a conductive material. The protection layer is peripherally enclosed by the substrate, the second bonding layer, and the first bonding layer. The protection layer covers a sidewall cut formed at an interface between the second bonding layer and the first bonding layer. The conductive material is peripherally enclosed by the protection layer.

In accordance with an embodiment of the present disclosure, the protection layer has a substantially flat surface in contact with the conductive material.

In accordance with another embodiment of the present disclosure, the protection layer has a substantially flat surface opposite the sidewall cut.

In accordance with yet another embodiment of the present disclosure, the protection layer has a protrusion protruding from an outer sidewall of the protection layer and in contact with the first bonding layer and the second bonding layer.

In accordance with yet another embodiment of the present disclosure, the protrusion has a V-shaped cross section.

In accordance with yet another embodiment of the present disclosure, the protection layer comprises nitrogen.

In accordance with yet another embodiment of the present disclosure, the protection layer comprises oxygen.

In accordance with yet another embodiment of the present disclosure, the protection layer has an oxygen concentration and a nitrogen concentration, and the oxygen concentration is greater than the nitrogen concentration.

In accordance with yet another embodiment of the present disclosure, a ratio of oxygen concentration to the nitrogen concentration is about 3:2.

In accordance with yet another embodiment of the present disclosure, the protection layer comprises SiON, SiN, or a combination thereof.

In accordance with yet another embodiment of the present disclosure, the protection layer surrounds the conductive material.

In accordance with another aspect of the present disclosure, the present disclosure discloses a semiconductor device. The semiconductor device comprises an image sensor device layer, an interconnect layer over the image sensor device layer, a first bonding layer over the interconnect layer, a second bonding layer bonded with the first bonding layer, a substrate over the second bonding layer, a conductive structure through the substrate, the second bonding layer, and the first bonding layer, and a protection layer wrapping around the conductive structure. The conductive structure is electrically connected to the interconnect layer. The protection layer has a protrusion protruding from an outer sidewall of the protection layer, and the protrusion is in contact with the first bonding layer and the second bonding layer.

In accordance with an embodiment of the present disclosure, the protection layer has a substantially flat surface opposite the protrusion.

In accordance with another embodiment of the present disclosure, the substantially flat surface of the protection layer is in contact with the conductive structure.

In accordance with yet another embodiment of the present disclosure, the protection layer comprises about 52 at % to about 68 at % of Si atoms.

In accordance with yet another embodiment of the present disclosure, the protection layer comprises about 19.5 at % to about 25.5 at % of O atoms.

In accordance with yet another embodiment of the present disclosure, the protection layer comprises about 13 at % to about 17 at % of N atoms.

In accordance with another aspect of the present disclosure, the present disclosure discloses a semiconductor device. The semiconductor device comprises an image sensor device layer, an interconnect layer over the image sensor device layer, a first bonding layer over the interconnect layer, a second bonding layer bonded with the first bonding layer, a substrate over the second bonding layer, a conductive structure through the substrate, the second bonding layer, and the first bonding layer, and a nitrogen-containing dielectric layer wrapping around the conductive structure. The conductive structure is electrically connected to the interconnect layer. The nitrogen-containing dielectric layer is in contact with the first bonding layer and the second bonding layer.

In accordance with an embodiment of the present disclosure, the nitrogen-containing dielectric layer comprises oxygen.

In accordance with another embodiment of the present disclosure, an oxygen concentration in the nitrogen-containing dielectric layer is greater than a nitrogen concentration in the nitrogen-containing dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising: an image sensor device layer; a first bonding layer over the image sensor device layer; a second bonding layer bonded with the first bonding layer; a substrate over the second bonding layer; and a conductive via passing through the substrate, the second bonding layer, and the first bonding layer, wherein the conductive via comprises: a protection layer peripherally enclosed by the substrate, the second bonding layer, and the first bonding layer, wherein the protection layer covers a sidewall cut formed at an interface between the second bonding layer and the first bonding layer; and a conductive material peripherally enclosed by the protection layer, wherein the protection layer has a protrusion protruding from an outer sidewall of the protection layer and in contact with the first bonding layer and the second bonding layer.

2. The semiconductor device of claim 1, wherein the protection layer has a substantially flat surface in contact with the conductive material.

3. The semiconductor device of claim 1, wherein the protection layer has a substantially flat surface opposite the sidewall cut.

4. The semiconductor device of claim 1, wherein the protrusion has a V-shaped cross section.

5. The semiconductor device of claim 1, wherein the protection layer comprises nitrogen.

6. The semiconductor device of claim 1, wherein the protection layer comprises oxygen.

7. The semiconductor device of claim 1, wherein the protection layer has an oxygen concentration and a nitrogen concentration, and the oxygen concentration is greater than the nitrogen concentration.

8. The semiconductor device of claim 7, wherein a ratio of oxygen concentration to the nitrogen concentration is about 3:2.

9. The semiconductor device of claim 1, wherein the protection layer comprises SiON, SiN, or a combination thereof.

10. The semiconductor device of claim 1, wherein the protection layer surrounds the conductive material.

11. A semiconductor device comprising:
an image sensor device layer;
an interconnect layer over the image sensor device layer;
a first bonding layer over the interconnect layer;

a second bonding layer bonded with the first bonding layer;

a substrate over the second bonding layer;

a conductive structure through the substrate, the second bonding layer, and the first bonding layer, the conductive structure being electrically connected to the interconnect layer; and a protection layer wrapping around the conductive structure and having a protrusion protruding from an outer sidewall of the protection layer, wherein the protrusion is in contact with the first bonding layer and the second bonding layer.

12. The semiconductor device of claim 11, wherein the protection layer has a substantially flat surface opposite the protrusion.

13. The semiconductor device of claim 12, wherein the substantially flat surface of the protection layer is in contact with the conductive structure.

14. The semiconductor device of claim 11, wherein the protection layer comprises about 52 at % to about 68 at % of Si atoms.

15. The semiconductor device of claim 11, wherein the protection layer comprises about 19.5 at % to about 25.5 at % of O atoms.

16. The semiconductor device of claim 11, wherein the protection layer comprises about 13 at % to about 17 at % of N atoms.

17. A semiconductor device comprising: an image sensor device layer; an interconnect layer over the image sensor device layer; a first bonding layer over the interconnect layer; a second bonding layer bonded with the first bonding layer; a substrate over the second bonding layer; a conductive structure through the substrate, the second bonding layer, and the first bonding layer, the conductive structure being electrically connected to the interconnect layer; and a nitrogen-containing dielectric layer wrapping around the conductive structure and in contact with the first bonding layer and the second bonding layer Wherein the nitrogen-containing dielectric layer has a protrusion protruding from an outer sidewall of the nitrogen-containing dielectric layer and in contact with the first bonding layer and the second bonding layer.

18. The semiconductor device of claim 17, wherein the nitrogen-containing dielectric layer comprises oxygen.

19. The semiconductor device of claim 17, wherein an oxygen concentration in the nitrogen-containing dielectric layer is greater than a nitrogen concentration in the nitrogen-containing dielectric layer.

* * * * *